United States Patent [19]
Johannes et al.

[11] Patent Number: 5,819,401
[45] Date of Patent: Oct. 13, 1998

[54] METAL CONSTRAINED CIRCUIT BOARD SIDE TO SIDE INTERCONNECTION TECHNIQUE

[75] Inventors: William R. Johannes, Albuquerque, N. Mex.; Patrick H. O'Neill; David M. Mendez, both of Austin, Tex.

[73] Assignee: Texas Instruments Incorporated, Dallas, Tex.

[21] Appl. No.: 847,978

[22] Filed: Apr. 24, 1997

Related U.S. Application Data

[62] Division of Ser. No. 656,960, Jun. 6, 1996.

[51] Int. Cl.⁶ ...................................................... H05K 3/36
[52] U.S. Cl. .............................. 29/830; 29/852; 174/262; 174/265; 439/65
[58] Field of Search ............................ 29/898, 852, 830; 174/262, 265; 439/65

[56] References Cited

U.S. PATENT DOCUMENTS

| | | |
|---|---|---|
| 4,591,220 | 5/1986 | Impey . |
| 5,227,588 | 7/1993 | Schreiber et al. . |
| 5,281,771 | 1/1994 | Swift et al. . |
| 5,601,678 | 2/1997 | Gerber et al. . |

Primary Examiner—Carl J. Arbes
Attorney, Agent, or Firm—René E. Grossman; Richard L. Donaldson

[57] ABSTRACT

A method of constructing a printed circuit board module and the module which comprises providing a substrate core having a first aperture extending therethrough and a pair of printed circuit boards, each board having at least one electrically conductive layer, secured to the substrate core and having a second aperture therethrough aligned with the first aperture. An electrically conductive member having an electrically insulating member is disposed around the electrically conductive member. The electrically conductive member having an electrically insulating member disposed therearound is positioned so that the electrically insulating member is disposed in the first aperture and the electrically conductive member extends into the second aperture of each of the printed circuit boards. The printed circuit boards are secured to the substrate core to lock the electrically insulating member in the first aperture. Solder is disposed within each of the second apertures electrically connecting the electrically conductive member to at least one electrically conductive layer of each of the pair of printed circuit boards or solder is disposed over at least one electrically conductive layer of each printed circuit board electrically connecting the electrically conductive member to at least one electrically conductive member. The electrically conductive member is preferably Invar/copper or copper.

12 Claims, 1 Drawing Sheet

METAL CONSTRAINED CIRCUIT BOARD SIDE TO SIDE INTERCONNECTION TECHNIQUE

This application is a Division of application Ser. No. 08/656,960, filed Jun. 6, 1996.

BACKGROUND OF THE INVENTION

1. Field of the Invention

This invention relates to a technique for interconnection of two printed circuit boards of a module.

2. Brief Description of the Prior Art

Multiprinted circuit board constructions or modules in accordance with the prior art have generally included a substrate core to which the circuit boards are affixed. The substrate core is used to constrain the movement of the printed circuit boards affixed thereto, especially when placed through a temperature cycle during later operations thereon, such as placement and securing of components thereon. The substrate core also provides heat sinking, mechanical rigidity and thermal relief for the circuitry on the boards. The substrate core is generally formed from Invar/copper, aluminum, beryllium, beryllium oxide or a variety of metal composites as is well known and is generally affixed to and spaced from the boards via an adhesive, preferably an epoxy. The printed circuit boards can be single or multiple layer boards, the multiple layer boards having layers of electrically conductive metal, preferably copper, with intervening electrically insulating layers, preferably an epoxy or polyimide glass-reinforced material, as is well known. The layers of electrically conductive metal can be interconnected through vias with electrically conductive material therein which extends between layers and makes connection thereto. The construction also has a through hole which passes through both printed circuit boards and the substrate core to interconnect one or more of the electrically conductive layers in each of the two printed circuit boards.

The through hole in accordance with the prior art has been a plated through hole which required a complex fabrication procedure. This procedure included predrilling of a hole in the substrate core, filling the drilled hole in the substrate core with an electrically insulating material, such as an epoxy glass bead filled resin. The printed circuit boards are then affixed to the substrate core in standard manner as described above and a secondary hole is then drilled which extends through the entire module including the electrically insulating material placed in the drilled hole in the substrate core, leaving the resin covering the exposed surfaces of the substrate core. Electrically conductive material, preferably copper, is then plated onto the walls of the drilled hole to provide the interconnect between the circuit boards, generally by plating.

As can be seen, the prior art procedure for interconnect between circuit boards required the steps of drilling a hole in the substrate core, filling that hole with an electrically insulating material, drilling a second hole which passes through both printed circuit boards which have now been secured to the substrate core and the electrically insulating material in the previously drilled hole with proper alignment to insure that the second hole passes through the center portion of the electrically insulating material. The walls of the second hole are then plated with an electrically conductive material. This procedure is lengthy and costly. At follows that an improved procedure for interconnection of the multiple printed circuit boards of a module would be highly beneficial.

SUMMARY OF THE INVENTION

In accordance with the present invention, there is provided such an improved procedure and module construction for interconnection of multiple printed circuit boards.

Briefly, in accordance with a first embodiment of the invention, there is provided a substrate core with multilayer printed circuit boards spaced from and bonded to the core by a layer of adhesive. Each of the printed circuit boards includes patterned layers of electrical conductor which are separated by layers of electrical insulator. Vias can interconnect two or more of the electrically conductive layers of each printed circuit board, all as in the prior art. The plural printed circuit boards are electrically interconnected by an electrically conductive core, preferably brass or copper, which passes through a hole in the substrate core and into holes aligned with that hole in each of the printed circuit boards. The core includes a compatible electrically insulating fitting therearound, secured thereto and disposed in the hole in the substrate core to prevent the core from contacting the substrate core. The core is soldered to one or more of the layers of electrically conductive material by a solder, preferably a tin/lead solder, preferably either by convection reflow or hand soldering.

In operation, the substrate core is machined to provide the through hole therein and the fitting is positioned in the hole with the core extending outwardly therefrom in opposing directions. The printed circuit boards with holes formed therein are then positioned over the substrate core so that the core passes into the holes in the boards and the boards are then affixed to the substrate core. The core is then secured to the electrically conductive material in each of the printed circuit boards with solder to provide the completed construction.

In accordance with a third embodiment, the core used for interconnection of the circuit boards is replaced by a bus wire connector. This connector passes through the holes in the substrate core and printed circuit boards and contacts the outside layer of electrically conductive material of each circuit board. This permits soldering of the core to the printed circuit board to take place external of the holes. Otherwise, this embodiment is the same as the second embodiment described above.

DESCRIPTION OF THE PREFERRED EMBODIMENT

Figure 1:
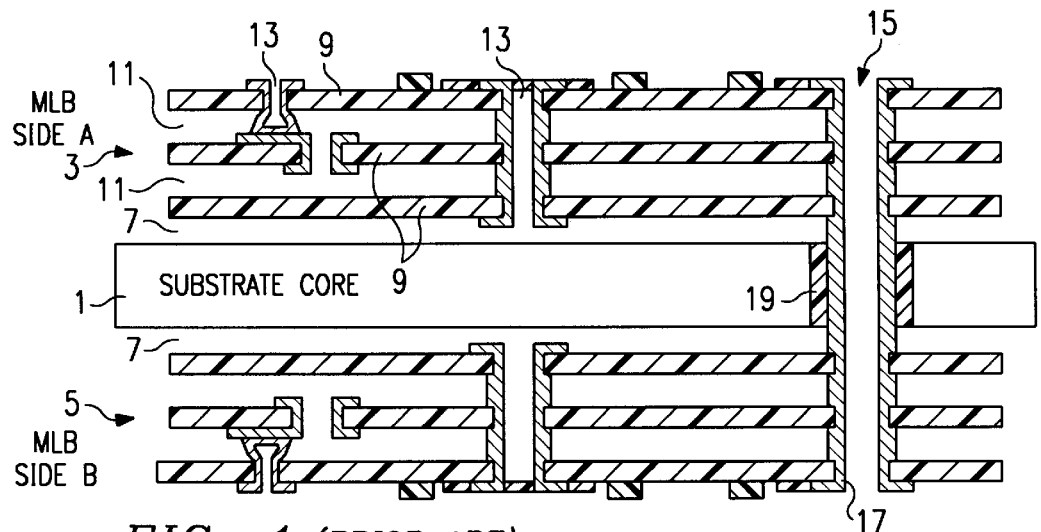
FIG. 1 is a cross sectional view of a printed circuit board construction in accordance with the prior art.

Referring first to FIG. 1, there is shown a typical prior art printed circuit board construction wherein two printed circuit boards 3 and 5 are secured to a substrate core 1 with an interconnect 17 between the two printed circuit boards. The construction includes the substrate core 1. Multilayer printed circuit boards 3 and 5 are spaced from and bonded to the substrate core 1 by a layer of adhesive 7, preferably an epoxy. Each of the printed circuit boards 3 and 5 includes patterned layers of electrically conductive material 9, preferably copper, which are separated by layers of electrically insulating material 11, preferably glass-reinforced polyimide. Vias 13 can interconnect two of the layers 9 or more than two of the layers 9. The printed circuit boards 3 and 5 are interconnected by a plated through hole 15 having electrically conductive material 17, preferably copper, on the walls thereof which extends from one or more of the layers 9 of circuit board 3 to one or more of the layers 9 of circuit board 5. The electrically conductive material 17 is spaced from the substrate core 1 by an electrically insulating spacer 19, preferably an epoxy glass bead filled resin.

The prior art procedure for fabrication of the interconnect 17 between circuit boards 3 and 5 required the steps of drilling a hole in the substrate core 1, filling that hole with an electrically insulating material, drilling a second hole 15 which passes through both later affixed printed circuit boards 3 and 5 and the previously drilled hole in the substrate core with proper alignment to insure that the second hole 15 passes through the center portion of the electrically insulating material and provides the spacer 19 and then plating an electrically conductive material 17 onto the walls of the second hole.

Figure 2:
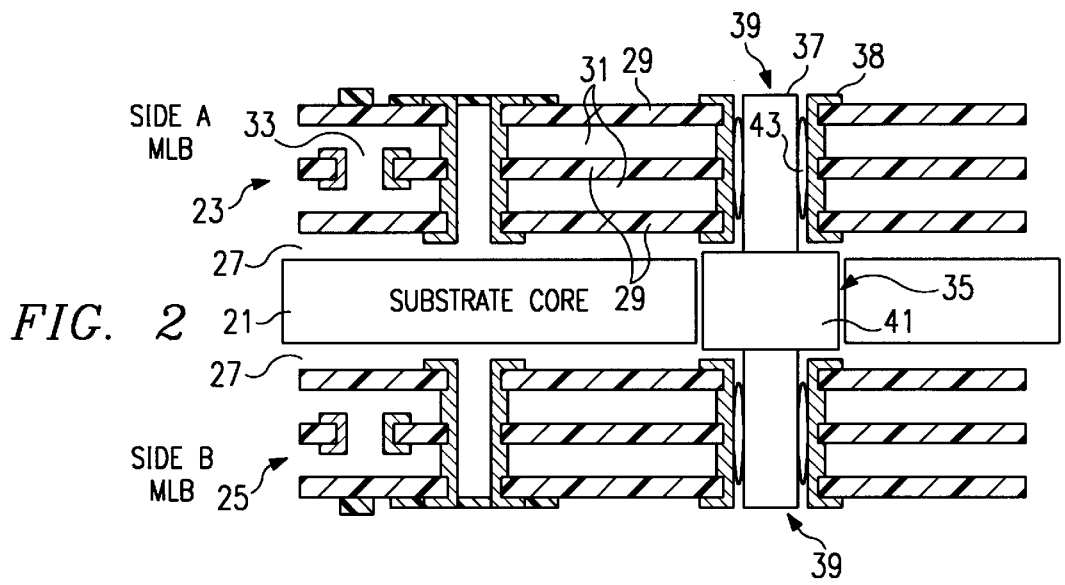
FIG. 2 is a cross sectional view of a printed circuit board construction in accordance with a first embodiment of the present invention.

Referring now to FIG. 2, there is shown a first embodiment of an improved interconnection technique in accordance with the present invention. The construction includes a substrate core 21. Multilayer printed circuit boards 23 and 25 are spaced from and bonded to the core 21 by a layer of adhesive 27, preferably an epoxy. Each of the printed circuit boards 23 and 25 includes patterned layers of electrically conductive material 29, preferably copper, which are separated by layers of electrically insulating material 31, preferably glass-reinforced polyimide. Vias 33 can interconnect two of the layers 29 or more than two of the layers 29. The printed circuit boards 23 and 25 are interconnected by a an electrically conductive core 37, preferably brass or copper, which passes through a hole 35 in the substrate core with electrically conductive plating 38 on the sides thereof aligned with hole 35 in each of the printed circuit boards 23 and 25. The core 37 includes a compatible electrically insulating fitting 41, secured thereto and disposed in the hole in the substrate core 21 to prevent the core 37 from contacting the substrate core 21. The core 37 is secured to one or more of the layers of electrically conductive material 29 by a solder 43, preferably a tin/lead solder, either by convection reflow or hand soldering.

In operation, the substrate core 21 is machined to provide the through hole 35 therein and the nylon fitting 41 is positioned in the hole 35 with core 37 extending outwardly therefrom in opposing directions. The printed circuit boards 23 and 25 with holes 39 formed therein are then positioned over the substrate core 21 so that the core 37 passes through the holes 39 and the boards are then affixed to the substrate core. The core 37 is then soldered to the electrically conductive material 29 with solder 43.

Figure 3:
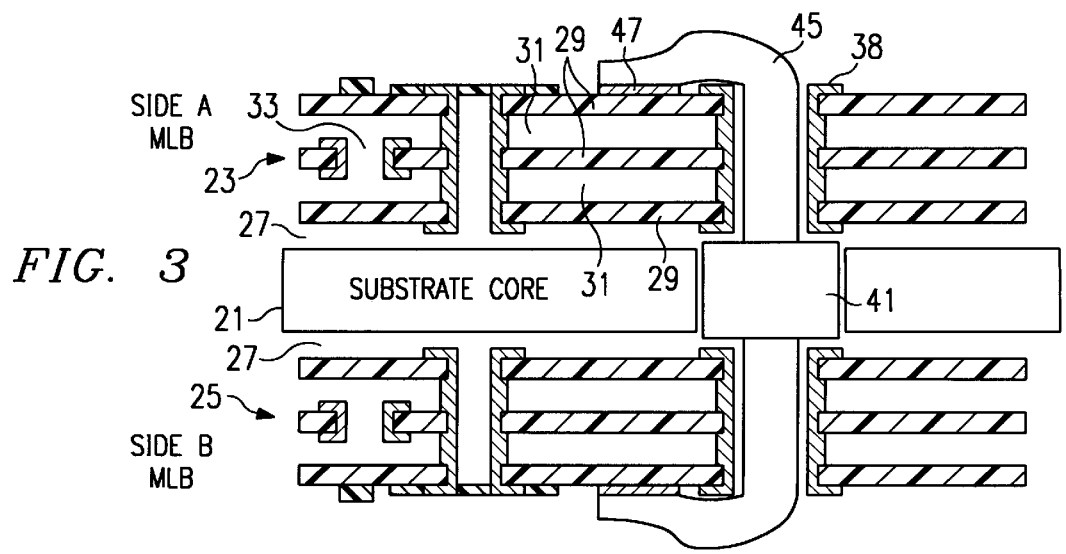
FIG. 3 is a cross sectional view of a printed circuit board construction in accordance with a second embodiment of the present invention.

Referring now to FIG. 3, there is shown a cross sectional view in accordance with a second embodiment of the present invention. This embodiment is identical to the first embodiment of the invention except that the core 37 has been replaced by a bus wire connector 45 which extends out of the holes 39 and makes contact with the outside layer of electrically conductive material 29 of each of the printed circuit boards 23 and 25 via solder 47. Otherwise, all elements denoted with the same reference number as in FIG. 2 are the same.

It can be seen that an improved procedure for interconnection of the multiple printed circuit boards of a module has been provided in accordance with the present invention.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of constructing a printed circuit board module (a) providing a substrate core having a first aperture extending therethrough;

(b) providing a pair of printed circuit boards, each board having at least one electrically conductive layer, secured to said substrate core and having a second aperture therethrough aligned with said first aperture;

(c) providing an electrically conductive member having an electrically insulating member disposed around said electrically conductive member;

(d) positioning said electrically conductive member having an electrically insulating member disposed around said electrically conductive member so that said electrically insulating member is disposed in said first aperture and said electrically conductive member extends into said second aperture of each of said printed circuit boards; and (e) securing said printed circuit boards to said substrate core to lock said electrically insulating member in said first aperture.

2. The method of claim 1 further including the step of disposing solder within each of said second apertures electrically connecting said electrically conductive member to said at least one electrically conductive layer of each of said pair of printed circuit boards.

3. The method of claim 1 further including the step of disposing solder over one of said at least one electrically conductive layer of each said printed circuit board electrically connecting said electrically conductive member to said one of said at least one electrically conductive member.

4. The method of claim 1 wherein said electrically conductive member is one of Invar/copper or copper.

5. The method of claim 2 wherein said electrically conductive member is one of Invar/copper or copper.

6. The method of claim 3 wherein said electrically conductive member is one of Invar/copper or copper.

7. The method of claim 1 wherein said electrically insulating member is a compatible electrically insulating material.

8. The method of claim 2 wherein said electrically insulating member is a compatible electrically insulating material.

9. The method of claim 3 wherein said electrically insulating member is a compatible electrically insulating material.

10. The method of claim 4 wherein said electrically insulating member is a compatible electrically insulating material.

11. The method of claim 5 wherein said electrically insulating member is a compatible electrically insulating material.

12. The method of claim 6 wherein said electrically insulating member is a compatible electrically insulating material.

* * * * *